(12) United States Patent
Chen et al.

(10) Patent No.: US 9,084,379 B2
(45) Date of Patent: Jul. 14, 2015

(54) PROCESS FOR FABRICATING WIRING BOARD

(75) Inventors: Tsung-Yuan Chen, Taoyuan County (TW); Chun-Chien Chen, Taipei County (TW); Cheng-Po Yu, Taoyuan County (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 779 days.

(21) Appl. No.: 13/423,578

(22) Filed: Mar. 19, 2012

(65) Prior Publication Data

US 2012/0174391 A1    Jul. 12, 2012

Related U.S. Application Data

(62) Division of application No. 12/328,446, filed on Dec. 4, 2008, now Pat. No. 8,450,621.

(30) Foreign Application Priority Data

Sep. 16, 2008   (TW) .............................. 97135492 A

(51) Int. Cl.
| | |
|---|---|
| *H01K 3/10* | (2006.01) |
| *H05K 3/00* | (2006.01) |
| *H05K 3/36* | (2006.01) |
| *H05K 1/00* | (2006.01) |
| *H05K 1/14* | (2006.01) |
| *H05K 3/42* | (2006.01) |
| *H05K 3/20* | (2006.01) |

(52) U.S. Cl.
CPC .............. *H05K 3/428* (2013.01); *H05K 3/0032* (2013.01); *H05K 3/0038* (2013.01); *H05K 3/0035* (2013.01); *H05K 3/20* (2013.01); *H05K 3/205* (2013.01); *H05K 2201/0969* (2013.01); *H05K 2201/09509* (2013.01); *H05K 2201/09563* (2013.01); *H05K 2203/0369* (2013.01); *H05K 2203/0376* (2013.01); *H05K 2203/0384* (2013.01); *H05K 2203/0554* (2013.01); *H05K 2203/108* (2013.01); *H05K 2203/1476* (2013.01); *Y10T 29/49124* (2015.01); *Y10T 29/49126* (2015.01)

(58) Field of Classification Search
CPC ................... Y10T 29/49124; Y10T 29/49126; Y10T 29/49155; Y10T 29/49165; H05K 3/3452; H05K 1/144; H05K 3/4069
USPC .................... 29/829, 830, 846, 852; 174/250; 361/736
See application file for complete search history.

(56) References Cited

U.S. PATENT DOCUMENTS

| | | | | |
|---|---|---|---|---|
| 4,954,313 A | * | 9/1990 | Lynch | ............................... 419/9 |
| 5,091,339 A | * | 2/1992 | Carey | ............................... 216/18 |
| 7,356,923 B2 | * | 4/2008 | Honer | ............................... 29/852 |
| 7,887,712 B2 | * | 2/2011 | Boyle et al. | ..................... 216/65 |
| 8,440,916 B2 | * | 5/2013 | Li et al. | ......................... 174/263 |
| 8,450,621 B2 | * | 5/2013 | Chen et al. | ..................... 174/261 |

* cited by examiner

*Primary Examiner* — David Angwin
(74) *Attorney, Agent, or Firm* — J.C. Patents

(57) ABSTRACT

A process for fabricating a wiring board is provided. In the process, a wiring carrying substrate including a carry substrate and a wiring layer is formed. Next, at least one blind via is formed in the wiring carrying substrate. Next, the wiring carrying substrate is laminated to another wiring carrying substrate via an insulation layer. The insulation layer is disposed between the wiring layers of the wiring carrying substrates and full fills the blind via. Next, parts of the carry substrates are removed to expose the insulation layer in the blind via. Next, a conductive pillar connected between the wiring layers is formed. Next, the rest carry substrates are removed.

13 Claims, 8 Drawing Sheets

PROCESS FOR FABRICATING WIRING BOARD

CROSS-REFERENCE TO RELATED APPLICATION

This application is a divisional application of U.S. application Ser. No. 12/328,446 filed on Dec. 4, 2008, now pending, which claims the priority benefit of Taiwan application serial no. 97135492, filed on Sep. 16, 2008. The entirety of the above-mentioned patent applications is hereby incorporated by reference herein and made a part of specification.

BACKGROUND OF THE INVENTION

1. Field of the Invention

The present invention relates to a process for fabricating a wiring board. More particularly, the present invention relates to a process for fabricating an embedded circuit board.

2. Description of Related Art

Embedded circuit boards are developed according to a current wiring board technique, and circuits on a surface of such wiring board are embedded in a dielectric layer, and are not protruded out from a surface of the dielectric layer.

FIG. 1A to FIG. 1E are cross-sectional views illustrating a fabrication flowchart of a conventional embedded circuit board. Referring to FIG. 1A, a method for fabricating the conventional embedded circuit board includes following steps. First, a copper metal layer 114a and a copper wiring layer 116a are sequentially formed on a carry substrate 112a to form a wiring carrying substrate 110a.

Referring to FIG. 1B, the wiring carrying substrate 110a is laminated on another wiring carrying substrate 110b via a prepreg, wherein a structure of the wiring carrying substrate 110b is the same to that of the wiring carrying substrate 110a. In detail, the wiring carrying substrate 110b also includes a carry substrate 112b, a copper wiring layer 116b and a copper metal layer 114b located between the copper wiring layer 116b and the carry substrate 112b. After the wiring carrying substrate 110a is laminated on the wiring carrying substrate 110b, the prepreg is cured to form a dielectric layer 120.

Referring to FIG. 1B and FIG. 1C, the carry substrate 112a and the carry substrate 112b are removed to remain the copper metal layers 114a and 114b, and the copper wiring layers 116a and 116b. Next, a mechanical drilling process and a plating through hole (PTH) process are sequentially performed to form a conductive through hole structure T1. When the conductive through hole structure T1 is formed, a copper plating layer 130a and a copper plating layer 130b are respectively formed on the copper metal layer 114a and the copper metal layer 114b.

Referring FIG. 1C and FIG. 1D, etching is performed to remove the copper plating layers 130a and 130b, and the copper metal layers 114a and 114b. Next, ink material 140 is filled into the conductive through hole structure T1.

Referring to FIG. 1D and FIG. 1E, after the ink material 140 is filled, a solder mask layer 150a is formed on the copper wiring layer 116a, and a solder mask layer 150b is formed on the copper wiring layer 116b. By such means, fabrication of the conventional embedded circuit board 100 is completed.

In the current wiring board technique, the embedded circuit board has a development trend of high-density layout and fine lines. However, during the process of laminating the wiring carrying substrate 110a to the wiring carrying substrate 110b (referring to FIG. 1B), the prepreg is deformed due to a press, which is referred to as shrink-swell in the art. Such deformation can generally change a whole dimensional scale of the embedded circuit board 100, and can also change a layout of the copper wiring layers 116a and 116b and a relative position of the conductive through hole structure T1.

In the current wiring board technique, a kind of the deformation generated during the laminating process can change the relative position between the layouts of the copper wiring layers 116a and 116b (which is also referred to as layer-layer shifting in the art). Though, the deformation that causes such layer-layer shifting can be properly controlled via a positioning apparatus of a lamination device, and a relative shifting amount thereof can be below 25 μm. Therefore, influence of the deformation generated due to the layer-layer shifting caused by the laminating process is greatly reduced.

The higher the layout densities of the copper wiring layers 116a and 116b are, the greater the shrink-swell deformation influences the layout of the copper wiring layers 116a and 116b, and the relative position of the conductive through hole structure T1. During the mechanical drilling, since the layouts of the copper wiring layers 116a and 116b are changed, when a Muraki tooling system is applied, the through hole generated based on the mechanical drilling process is shifted, and even broken out (for example, the conductive through hole structure T2 in FIGS. 1C-1E).

The mechanical drilling process is taken as an example in the aforementioned conventional technique, though for the conductive blind via generated based on a laser drilling technique, the break out phenomenon, the positioning apparatus and the positioning principle are all the same to that of the mechanical drilling process, and even the rejection and a reason of the rejection are all similar, and therefore detailed description thereof is not repeated.

SUMMARY OF THE INVENTION

The present invention is directed to a fabrication process for making a wiring board.

The present invention provides a process for fabricating a wiring board. First, a first wiring carrying substrate is formed, which includes a first carry substrate and a first wiring layer disposed on the first carry substrate. Next, at least one first blind via is formed in the first wiring carrying substrate, wherein the first blind via extends from the first wiring layer into the first carry substrate. Next, the first wiring carrying substrate is laminated to a second wiring carrying substrate via an insulation layer, wherein the second wiring carrying substrate includes a second carry substrate and a second wiring layer disposed on the second carry substrate. The insulation layer is disposed between the first wiring layer and the second wiring layer, and fills the first blind via. Next, a part of the first carry substrate and a part of the second carry substrate are removed to expose the insulation layer in the first blind via. Next, a part of the insulation layer in the first blind via is removed to form a hole extending from the first wiring layer to the second wiring layer. Next, a conductive pillar is formed in the hole, wherein the conductive pillar is connected between the first wiring layer and the second wiring layer. Next, the remained first carry substrate and the remained second carry substrate are removed.

In an embodiment of the present invention, a method of forming the hole includes thermally ablating a part of the insulation in the first blind via by using a laser beam.

In an embodiment of the present invention, the laser beam is provided by a carbon dioxide laser device, an ultra violet laser device or a yttrium aluminium garnet (YAG) laser device.

In an embodiment of the present invention, a method of forming the hole includes performing a mechanical drilling process.

In an embodiment of the present invention, the second wiring carrying substrate has at least a second blind via extending from the second wiring layer to the second carry substrate. When the first wiring carrying substrate is laminated on the second wiring carrying substrate, the insulation layer further fills the second blind via, and after a part of the second carry substrate is removed, the insulation layer in the second blind via is exposed.

In an embodiment of the present invention, the second blind via is opposite to the first blind via. When a part of the insulation layer in the first blind via is removed, a part of the insulation layer in the second blind via is also removed for connecting the first blind via and the second blind via.

In an embodiment of the present invention, a method of forming the first wiring carrying substrate includes following steps. First, a mask layer is formed on the first carry substrate, wherein the mask layer partially covers a surface of the first carry substrate. Next, the first wiring layer and a barrier layer is formed, wherein the first wiring layer and the barrier layer are located on the surface of the first carry substrate partially exposed by the mask layer, and the first wiring layer is located between the barrier layer and the first carry substrate. The first wiring layer and the barrier layer wholly cover the surface of the first carry substrate.

In an embodiment of the present invention, a method of forming the first blind via includes removing a part of the mask layer to form at least an opening partially exposing the first carry substrate, and removing a part of the first carry substrate in the opening.

In an embodiment of the present invention, a method of removing a part of the mask layer includes removing a part of the mask layer by using a laser beam.

In an embodiment of the present invention, a method of removing the first carry substrate includes etching the first carry substrate.

In an embodiment of the present invention, after the first blind via is formed, the method further includes removing the barrier layer and the remained mask layer.

In an embodiment of the present invention, a method of forming the blind via includes thermally ablating a part of the first carry substrate by using a laser beam.

In an embodiment of the present invention, the insulation layer is a resin layer or prepreg.

The present invention provides a wiring board having at least a hole. The wiring board includes a first wiring layer, a second wiring layer, an insulation layer and at least a conductive pillar. The insulation layer is disposed between the first wiring layer and the second wiring layer, wherein the hole extends from the first wiring layer to the second wiring layer. The conductive pillar is disposed in the hole, and is connected between the first wiring layer and the second wiring layer, wherein the conductive pillar has a top surface and a bottom surface opposite to the top surface. The diameter of conductive pillar gradually shrinks from a junction between the first wiring layer and the insulation layer towards the top surface.

In an embodiment of the present invention, the conductive pillar full fills the hole.

In an embodiment of the present invention, an interface is respectively existed between the conductive pillar and the first wiring layer, and between the conductive pillar and the second wiring layer.

In an embodiment of the present invention, the hole is a blind via, and the diameter of conductive pillar gradually shrinks from a junction between the first wiring layer and the insulation layer towards the bottom surface.

In an embodiment of the present invention, the hole is a through hole, and the diameter of conductive pillar gradually shrinks from a junction between the second wiring layer and the insulation layer towards the bottom surface.

In the present invention, at least one blind via (for example, the first blind via) is preformed on the wiring carrying substrate (for example, the first wiring carrying substrate), and the insulation layer full fills the blind via. Therefore, after a part of the carry substrate is removed, the insulation layer in the blind via is exposed to serve as marks for marking positions of later formed holes. By such means, a chance of hole shifting can be reduced, so as to improve the production yield of the wiring board.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
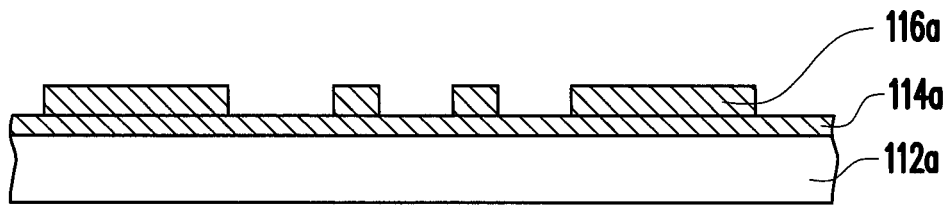
FIG. 1A to FIG. 1E are cross-sectional views illustrating a flowchart of a conventional embedded circuit board fabrication process.
Figure 1B:
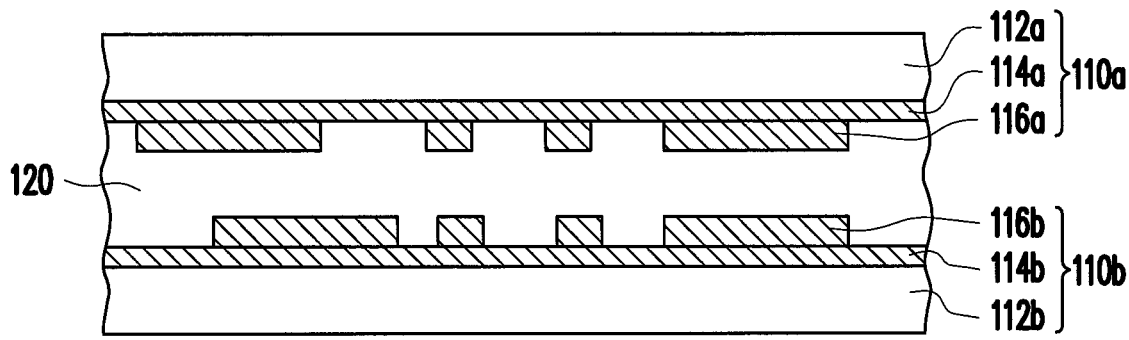
Figure 1C:
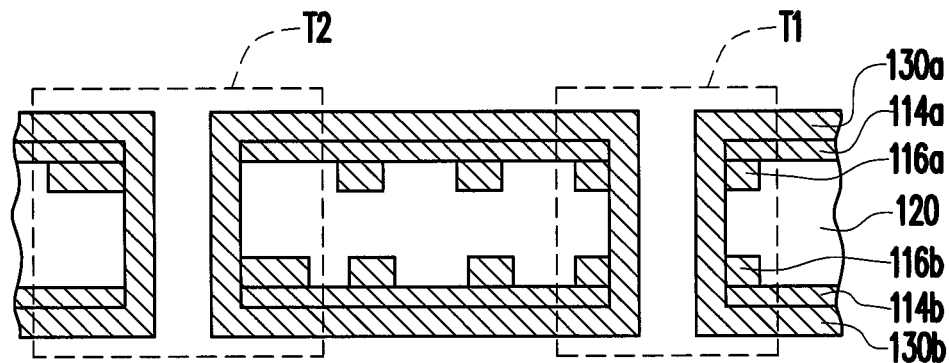
Figure 1D:
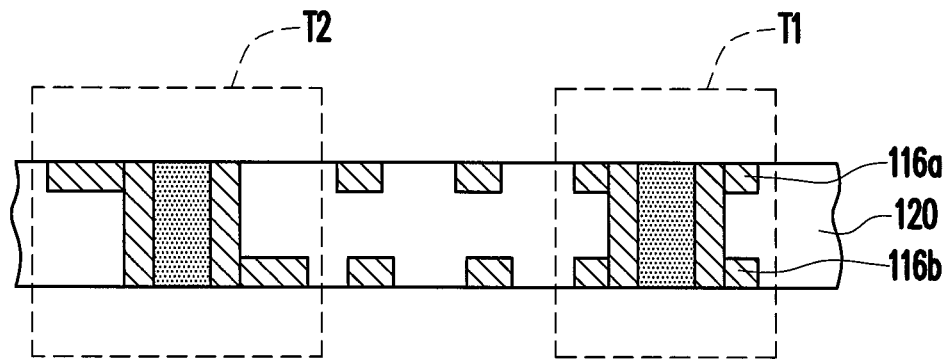
Figure 1E:
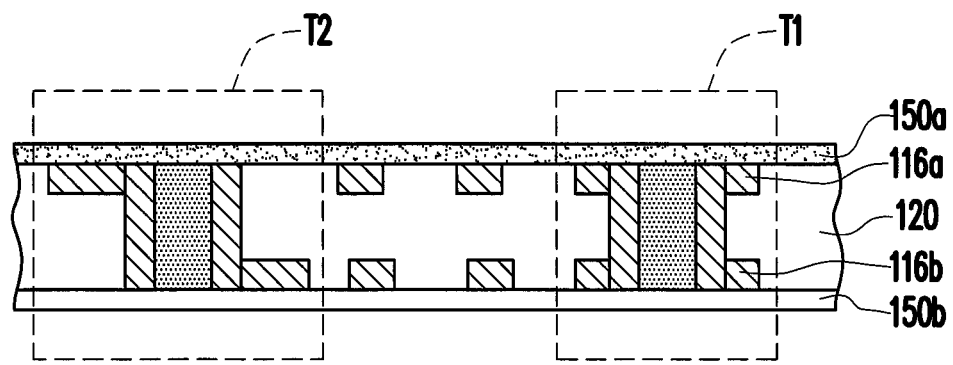
Figure 2A:
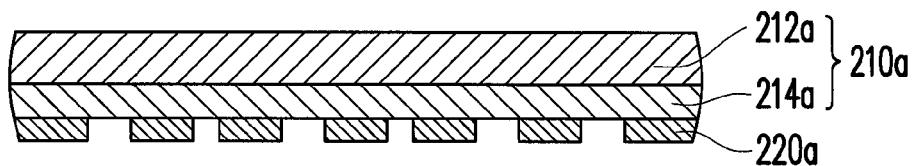
FIG. 2A to FIG. 2G are cross-sectional views illustrating a fabrication flowchart of a wiring board according to an embodiment of the present invention.

FIG. 2A to FIG. 2G are cross-sectional views illustrating a fabrication flowchart of a wiring board according to an embodiment of the present invention. Referring to FIG. 2A, the fabrication process of the wiring board of the present embodiment can be described as follows. First, a first wiring carrying substrate 200a including a first carry substrate 210a and a first wiring layer 220a is formed, wherein the first wiring layer 220a is disposed on the first carry substrate 210a.

The first carry substrate 210a can be a metal plate, which can be a plate formed by a single metal material, or a composite plate formed by multi metal layers. As shown in FIG. 2A, the first carry substrate 210a include two metal layers 212a and 214a, wherein material of the metal layer 212a is for example, aluminium, nickel, tin, and material of the metal layer 214a is for example, copper, aluminium, zinc, nickel or other metal materials having a high conductivity.

The first wiring layer 220a can be formed by electroplating. In detail, a mask layer can be first formed on the first carry substrate 210a, wherein the mask layer partially exposes the surface of the metal layer 214a, and the mask layer is for example a dry film after a lithography process or a wet photoresist. Next, the first carry substrate 210a is electroplated to form the first wiring layer 220a. After the first wiring layer 220a is formed, the mask layer is then totally removed.

Figure 2B:
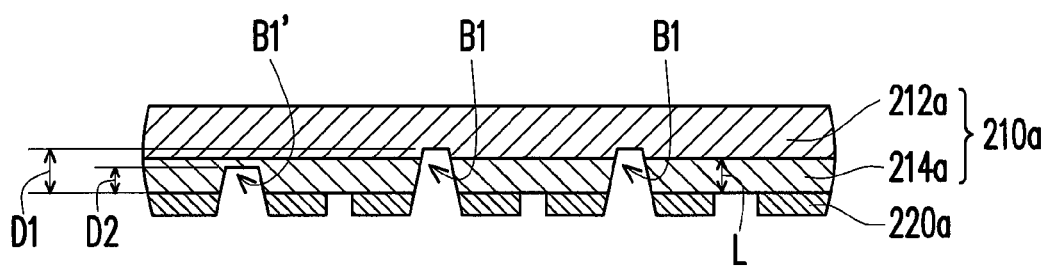

Referring to FIG. 2B, a plurality of first blind via B1 and B1' are formed on the first wiring carry substrate 200a, wherein the first blind via B1 and B1' extends from the first wiring layer 220a into the first carry substrate 210a. Moreover, opening sizes of the first blind via B1 and B1' are greater than bottom sizes of the first blind via B1 and B1', as shown in FIG. 2B. The method of forming the first blind via B1 and B1' includes thermally ablating a part of the first carry substrate 210a by using a laser beam, wherein the laser beam is for example provided by an ultra violet laser device.

A difference between the first blind via B1 and the first blind via B1' is that depths thereof are different. In detail, a depth D1 of the first blind via B1 is greater than a depth D2 of the first blind via B1', and the depth D1 is further greater than a thickness L of the metal layer 214a. The depth D2 of the first blind via B1' is less than the thickness L of the metal layer 214a, and the depth D2 can be greater than or equal to four-fifths of the thickness L.

It should be noted that though a plurality of the first blind via B1 and B1' is illustrated in FIG. 2B, it is only an example, and in other embodiments, only one first blind via B1 or one first blind via B1' can be formed. Namely, a total quantity of the first blind via B1 and B1' can be one. Therefore, the quantity of the first blind via B1 and B1' shown in FIG. 2B is not used for limiting the present invention.

Figure 2C:
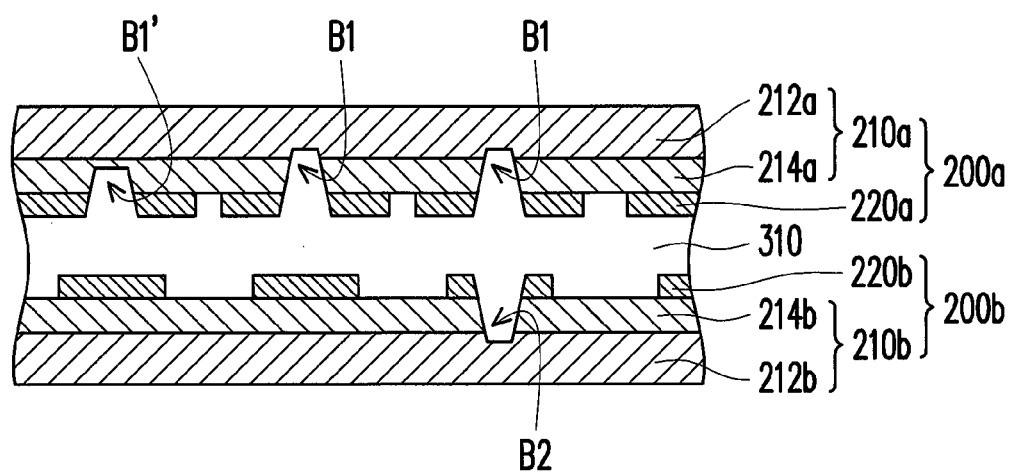

Referring to FIG. 2C, the first wiring carrying substrate 200a is laminated to the second wiring carrying substrate 200b via an insulation layer 310, i.e. the insulation layer 310 is disposed between the first wiring layer 220a and the second wiring layer 220b. Moreover, the first wiring layer 220a and the second wiring layer 220b are all embedded into the insulation layer 310, as shown in FIG. 2C.

The second wiring carrying substrate 200b includes a second carry substrate 210b and a second wiring layer 220b, wherein the second wiring layer 220b is disposed on the second carry substrate 210b. Therefore, structure of the first wring carrying substrate 200a is similar to that of the second wiring carrying substrate.

The second carry substrate 210b can be a plate formed by a single metal material, or a composite plate formed by multi metal layers, and structure of the second carry substrate 210b is the same to that of the first carry substrate 210a. In detail, the second carry substrate 210b includes two metal layers 212b and 214b, wherein the material of the metal layer 212b can be the same to that of the metal layer 212a, and the material of the metal layer 214b can be the same to that of the metal layer 214a.

In the present embodiment, the second wiring carrying substrate 200b has at least one second blind via B2, wherein the second blind via B2 extends from the second wiring layer 220b into the second carry substrate 210b. A depth of the second blind via B2 can be greater than a thickness of the metal layer 214b, as shown in FIG. 2C. Certainly, in other embodiments that are not illustrated, the depth of the second blind via B2 can be less than the thickness of the metal layer 214b.

The second blind via B2 corresponds to one of the first blind via B1, i.e. the second blind via B2 is located opposite to one of the first blind via B1. In other embodiments that are not illustrated, the second blind via B2 can also correspond to one of the first blind via B1'. Namely, the second blind via B2 can be located opposite to one of the first blind via B1 or one of the first blind via B1'. Certainly, the second blind via B2 can also correspond to none of the first blind via B1 and B1'. Moreover, a method of forming the second blind via B2 is the same to that of the first blind via B1 and B1', and therefore detailed description thereof is not repeated.

It should be noted that in the present embodiment, the second blind via B2 is not a necessary technique feature of the present invention. Namely, the second wiring carrying substrate 200b can have none second blind via B2. Certainly, the second wiring carrying substrate 200b can also have a plurality of the second blind via B2. Therefore, the quantity of the second blind via B2 shown in FIG. 2C is only an example, which is not used for limiting the present invention.

When the first wiring carrying substrate 200a is laminated to the second wiring carrying substrate 200b, the insulation layer 310 full fills the first blind via B1 and B1' and the second blind via B2. In detail, the insulation layer 310 can be a material with viscousness and mobility, for example resin or prepreg. Therefore, during the lamination, the insulation layer 310 can full fill the first blind via B1 and B1' and the second blind via B2.

Figure 2D:
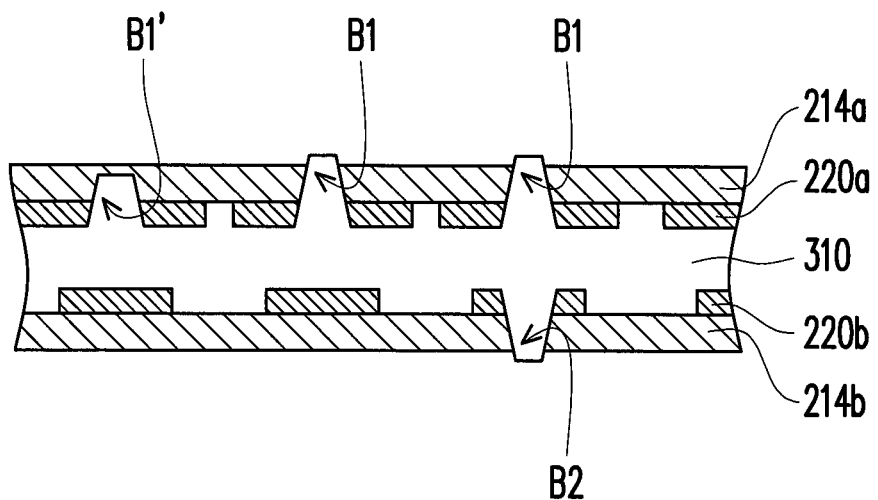

Referring to FIG. 2C and FIG. 2D, a part of the first carry substrate 210a and a part of the second carry substrate 210b are removed to expose the insulation layer 310 in the first blind via B1. In detail, the method for removing a part of the first carry substrate 210a and a part of the second carry substrate 210b includes removing the metal layer 212a and the metal layer 212b. Since the depth of the first blind via B1 is greater than the thickness of the metal layer 214a, and the depth of the second blind via B2 is greater than the thickness of the metal layer 214b, after the metal layer 212a and the metal layer 212b are removed, the insulation layer 310 located within the first blind via B1 and the second blind via B2 is then exposed.

The method for removing the metal layer 212a and the metal layer 212b includes etching the metal layer 212a and the metal layer 212b. Moreover, the first carry substrate 210a and the second carry substrate 210b can be composite metal plates containing a polymer material layer. Therefore, the metal layer 212a and the metal layer 212b can be removed by peeling.

Figure 2E:
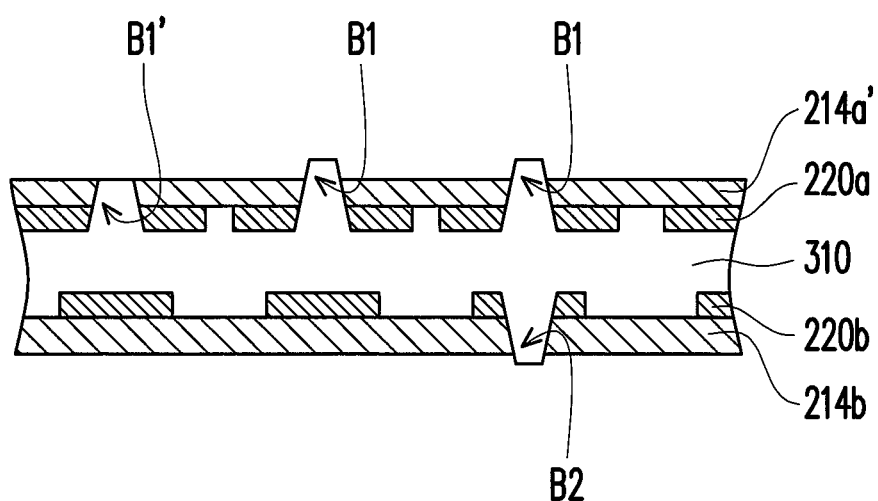

Referring to FIG. 2D and FIG. 2E, a part of the metal layer 214a can be removed to form a metal layer 214a', so as to expose the insulation layer 310 in the first blind via B1'. The method of removing a part of the metal layer 214a includes etching the metal layer 214a, for example, performing a micro-etching by dipping the metal layer 214a into etching fluid.

It should be noted that in the method of removing a part of the first carry substrate 210a and a part of the second carry substrate 210b disclosed in FIG. 2C to FIG. 2E, the step of FIG. 2D can be omitted in the present embodiment, i.e. the step of removing a part of the metal layer 214a. In detail, in the present embodiment, only the first blind via B1 with depth being greater than the thickness of the metal layer 214a and the second blind via B2 with depth being greater than the thickness of the metal layer 214b can be formed. In this case, after the metal layer 212a and the metal layer 212b are removed, the insulation layer 310 located in the first blind via B1 and the second blind via B2 is exposed. Therefore, the method of removing a part of the first carry substrate 210a and a part of the second carry substrate 210b disclosed in FIG. 2C to FIG. 2E is only an example, which is not used for limiting the present invention.

Figure 2F:
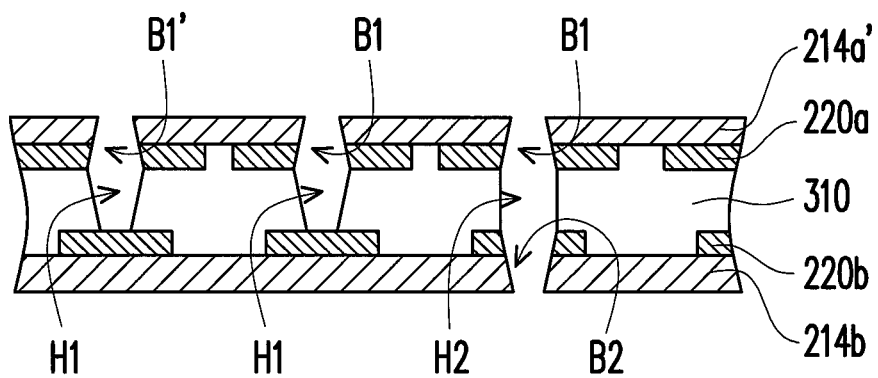

Referring to FIG. 2E and FIG. 2F, after the insulation layer 310 located in the first blind via B1 and B1' and the second blind via B2 is exposed, a part of the insulation layer 310 in the first blind via B1 and B1' is removed to form a plurality of holes H1 and H2. The holes H1 and H2 are connected to the first blind via B1 and B1'. Moreover, the holes H1 and H2 extend from the first wiring layer 220a to the second wiring layer 220b.

Structurally, the hole H1 is the blind via, i.e. the hole H1 does not penetrate through the second wiring layer 220b and the metal layer 214b. The hole H2 not only connects one of the first blind via B1, but also connects the second blind via B2.

Therefore, the hole H2 is the through hole, structurally. Namely, the hole H2 penetrates through the second wiring layer 220b and the metal layer 214b. In detail, when a part of the insulation layer 310 in the first blind via B1 and B1' is removed, a part of the insulation layer 310 in the second blind via B2 can further be removed to form the hole H2. Therefore, one of the first blind via B1 is connected to the second blind via B2. Moreover, in other embodiments that are not illustrated, the first blind via B1' can also be connected to the second blind via B2.

Since a part of the insulation layer 310 is exposed in the first blind via B1 and B1' and the second blind via B2, the exposed part of the insulation layer 310 can serve as marks for marking positions of the holes H1 and H2 to be formed. By such means, a chance of forming the holes H1 and H2 at wrong positions can be reduced, so as to avoid shifting of the holes H1 and H2, and improve the production yield of the wiring board.

Moreover, the method of forming the holes H1 and H2 includes thermally ablating the part of the insulation layer 310 in the first blind via B1 and B1' and the second blind via B2 by using the laser beam, or by performing a mechanical drilling process. According to the method of thermally ablating a part of the insulation layer 310 by using the laser beam, in the present embodiment, a laser beam which can easily burn and vaporize the insulation layer 310 without damaging the first wiring layer 220a and the metal layer 214a' can be applied, for example, a laser beam provided by a carbon dioxide laser device. Therefore, the part of the insulation layer 310 in the first blind via B1 and B1' and the second blind via B2 can be accurately removed to increase a chance of forming the holes H1 and H2 at correct positions. Besides the carbon dioxide laser device, the laser beam of the present invention can also be provided by an ultra violet laser device or a yttrium aluminium garnet (YAG) laser device.

Figure 2G:
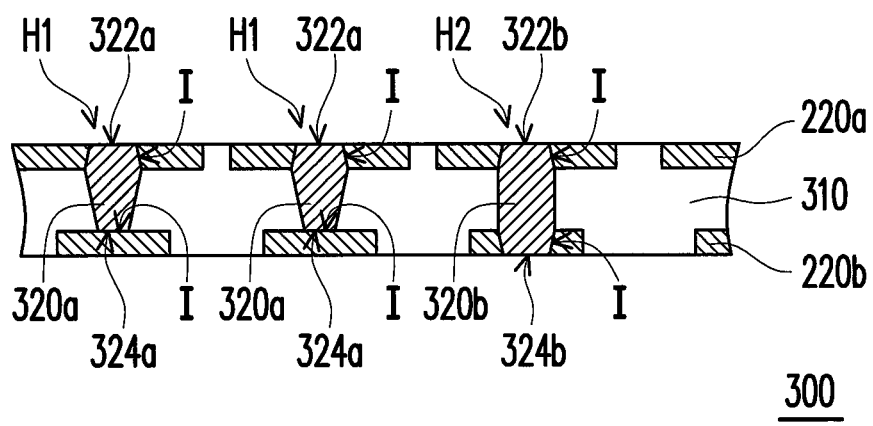

Referring to FIG. 2F and FIG. 2G, a plurality of conductive pillars 320a and 320b are formed in the holes H1 and H2, wherein the conductive pillars 320a and 320b are connected between the first wiring layer 220a and the second wiring layer 220b. Namely, the first wiring layer 220a is electrically connected to the second wiring layer 220b via the conductive pillars 320a and 320b. The conductive pillars 320a and 320b are disposed in the holes H1 and H2. Each of the conductive pillars 320a has a top surface 322a and a bottom surface 324a, and the conductive pillar 320b has a top surface 322b and a bottom surface 324b. The top surface 322a is opposite to the bottom surface 324a, and the top surface 322b is opposite to the bottom surface 324b.

Since opening sizes of the first blind via B1 and B1' are greater than bottom sizes of the first blind via B1 and B1' (referring to FIG. 2B), influenced by structures of the first blind via B1 and B1', the diameters of conductive pillars 320a and 320b gradually shrink from a junction between the first wiring layer 220a and the insulation layer 310 towards the top surfaces 322a and 322b. Moreover, the diameters of conductive pillars 320a in the holes H1 gradually shrink from the junction between the first wiring layer 220a and the insulation layer 310 towards the bottom surface 324a, and the diameter of conductive pillar 320b in the hole H2 gradually shrinks from a junction between the second wiring layer 220b and the insulation layer 310 towards the bottom surface 324b, as shown in FIG. 2G.

In the embodiment of FIG. 2G, the holes H1 and H2 are full filled by the conductive pillars 320a and 320b, wherein the conductive pillars 320a and 320b are solid cylinders. However, in other embodiments that are not illustrated, the holes H1 and H2 are not full filled by the conductive pillars 320a and 320b. Namely, the conductive pillars 320a and 320b can be hollow cylinders.

Methods of forming the conductive pillars 320a and 320b are diversified. In the present embodiment, the conductive pillars 320a and 320b can be formed via an electroless plating process or an electroplating process. Moreover, the conductive pillars 320a and 320b are not formed by a same fabrication process with that of the first wiring layer 220a and the second wiring layer 220b. Therefore, even if the conductive pillars 320a and 320b, the first wiring layer 220a and the second wiring layer 220b are all formed by the same material, an interface I is still existed between the conductive pillars 320a and 320b and the first wiring layer 220a and the second wiring layer 220b, respectively. The interfaces I can be viewed via a microsection technique with coordination of a general magnifier or an optical microscope.

Referring to FIG. 2F and FIG. 2G, it should be noted that a quantity of the formed conductive pillars 320b relates to a quantity of the second blind via B2, and a quantity of the formed conductive pillars 320a simultaneously relates to a quantity of the first blind via B1 and B1' and the second blind via B2. For example, if the total quantity of the second blind via B2 is one, the quantity of the formed conductive pillar 320b is also one. If the total quantity of the first blind via B1 and B1' is M, and the total quantity of the second blind via B2 is N, the quantity of the formed conductive pillar 320a is then equal to M-N. Therefore, the quantity of the conductive pillars 320a and 320b shown in FIG. 2G is only an example, which is not used for limiting the present invention.

After the conductive pillars 320a and 320b are formed, the remained first carry substrate 210a (for example the metal layer 214a' shown in FIG. 2F) and the remained second carry substrate 210b (for example, the metal layer 214b shown in FIG. 2F) are removed. Wherein, method of removing the metal layer 214a' and the metal layer 214b includes etching the metal layer 214a' and the metal layer 214b. Now, fabrication of a wiring board 300 including the first wiring layer 220a, the second wiring layer 220b, the insulation layer 310 and a plurality of the conductive pillars 320a and 320b is completed. Moreover, after the wiring board 300 is completed, a solder mask layer can be formed on the first wiring layer 220a and the second wiring layer 220b for protection.

FIG. 3A to FIG. 3G are cross-sectional views illustrating a fabrication flowchart of a wiring board according to another embodiment of the present invention. The present embodiment is similar to the aforementioned embodiment, and differences there between lie in the fabrication process of the wiring board. Therefore, only the differences between the present embodiment and the aforementioned embodiment are described in FIG. 3A to FIG. 3G and the following contents.

Figure 3A:
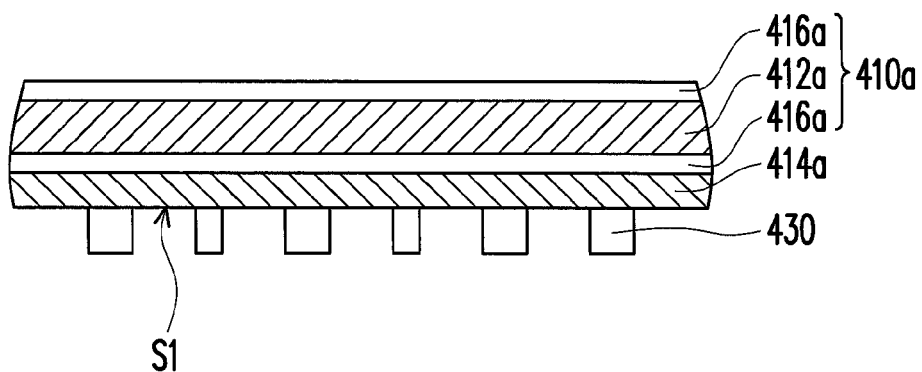
FIG. 3A to FIG. 3G are cross-sectional views illustrating a fabrication flowchart of a wiring board according to another embodiment of the present invention.
Figure 3B:
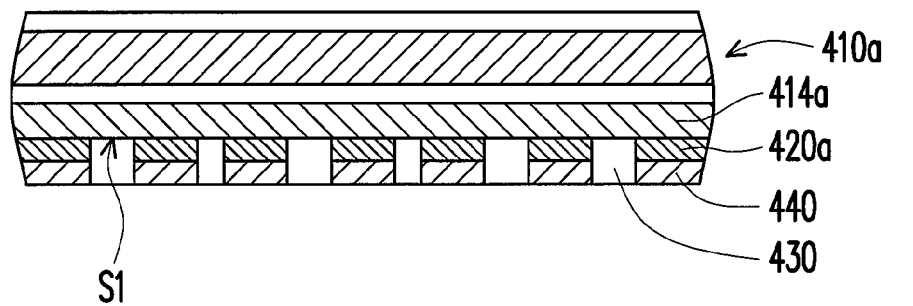

FIG. 3A and FIG. 3B mainly disclose a method of forming a first wiring carrying substrate 400a. Referring to FIG. 3A, a mask layer 430 is first formed on a first carry substrate 410a, wherein the mask layer 430 partially covers a surface S1 of the first carry substrate 410a.

The mask layer 430 can be a dry film or a wet photoresist, and can be formed via a lithography process. The first carry substrate 410a is for example, a composite plate formed by multi metal layers, and the first carry substrate 410a includes three kinds of metal layers 412a, 414a and 416a, wherein the metal layer 412a is disposed between two metal layers 416a, and one of the metal layers 416a is disposed between the metal layer 414a and the metal layer 412a. Moreover, materials of the metal layer 412a and the metal layers 416a are different.

The material of the metal layer 412a can be aluminium, copper, tin or other metal materials having high strength and high toughness, and the material of the metal layer 414a can be copper, aluminium, zinc, nickel or other metal materials having high conductivity. When the material of the metal layer 412a is aluminium, the material of the metal layer 416a can be the metal material with lower activity compared to that of the aluminium, such as zinc, nickel or tin, so as to prevent the metal layer 416a from being damaged by chemical solutions such as etching fluid, etc. during fabrication process of the wiring board, and meanwhile influence of fabrication environment and reduction of production yield due to damaging of the metal layer 416a can be avoided.

Referring to FIG. 3B, a first wiring layer 420a and a barrier layer 440 are formed, wherein the first wiring layer 420a and the barrier layer 440 are located on the surface S1 of the first carry substrate 410a partially exposed by the mask layer 430, and the first wiring layer 420a is located between the barrier layer 440 and the first carry substrate 410a, as shown in FIG. 3B. After the first wring layer 420a and the barrier layer 440 are formed, fabrication of the first wiring carrying substrate 400a' is finished.

Material of the first wring layer 420a is different to that of the barrier layer 440. The material of the first wiring layer 420a is for example copper, and the material of the barrier layer 440 is for example nickel. Moreover, the method of forming the first wiring layer 420a and the barrier layer 440 is the same to that of the first wiring layer 220a of the aforementioned embodiment, and therefore detailed description thereof is not repeated.

Figure 3C:
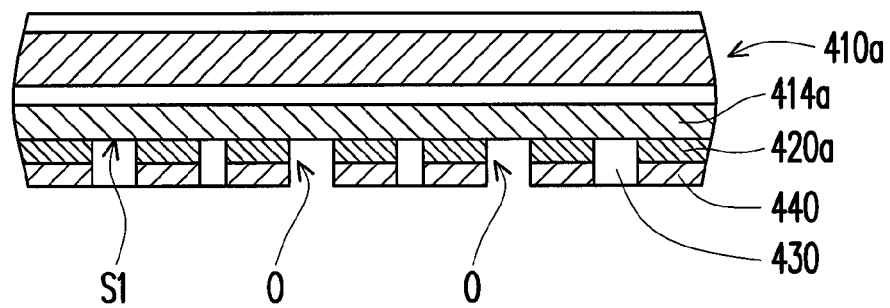
Figure 3D:
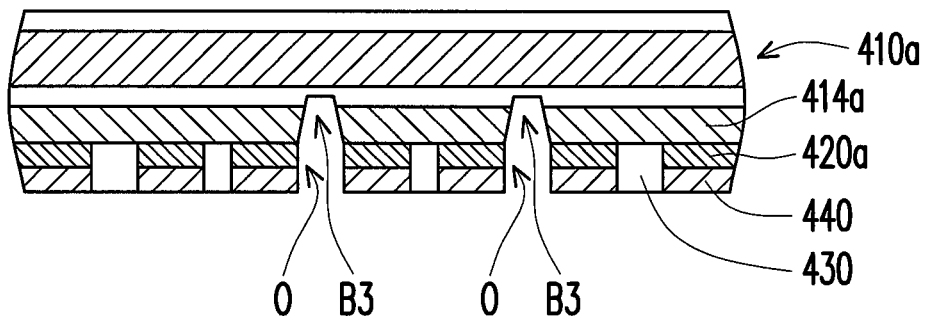

FIG. 3B to FIG. 3D mainly disclose a method of forming a plurality of first blind via B3. Referring to FIG. 3B and FIG. 3C, after the first wiring layer 420a and the barrier layer 440 are formed, a part of the mask layer 430 is removed to form a plurality of openings O, wherein the openings O partially expose the surface S1 of the first carry substrate 410a.

Method of removing a part of the mask layer 430 includes removing a part of the mask layer 430 by using laser beam, and the laser beam can be provided by a carbon dioxide laser device, an ultra violet laser device or a YAG laser device.

Referring to FIG. 3C and FIG. 3D, a part of the first carry substrate 410a in the openings O is removed to form a plurality of first blind via B3. Depth of the first blind via B3 can be greater than a thickness of the metal layer 414a, as shown in FIG. 3D. Certainly, according to the first blind via B1' disclosed in FIG. 2B, the depth of the first blind via B3 of the present embodiment can also be less than the thickness of the metal layer 414a.

Method of removing a part of the first carry substrate 410a includes etching the first carry substrate 410a. In detail, after the openings O are formed, the mask layer 430 and the barrier layer 440 can function as an etching mask. When the first carry substrate 410a is etched, a kind of etching fluid that can etch the metal layer 414a without damaging the mask layer 430 and the barrier layer 440 can be applied. Therefore, the first blind via B3 can be formed without damaging the first wiring layer 420a.

It should be noted that quantities the openings O and the first blind via B3 shown in FIG. 3C and FIG. 3D are more than one, though in other embodiments that are not illustrated, the quantities of the openings O and the first blind via B3 can be one. Therefore, the quantities of the openings O and the first blind via B3 shown in FIG. 3C and FIG. 3D are only an example, which is not used for limiting the present invention.

Figure 3E:
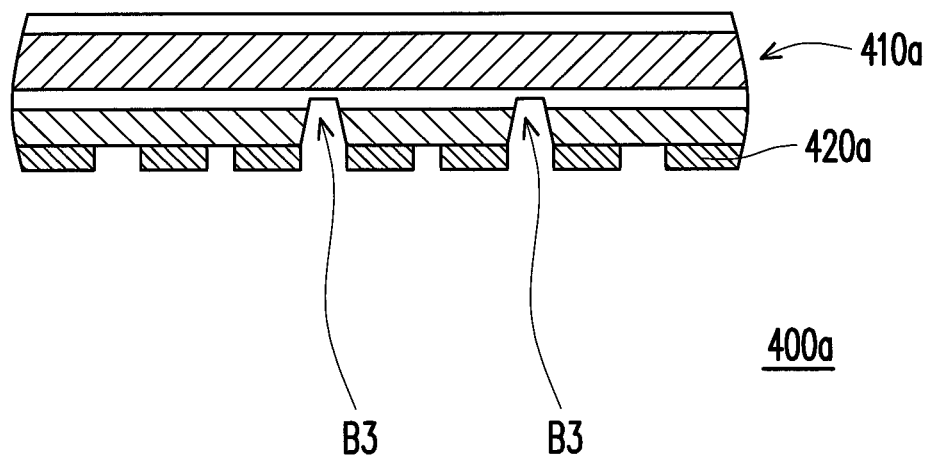

Referring to FIG. 3D and FIG. 3E, after the first blind via B3 are formed, the barrier layer 440 and the remained mask layer 430 are removed to expose the first wiring layer 420a. Now, fabrication of the first wiring carrying substrate 400a is completed.

Figure 3F:
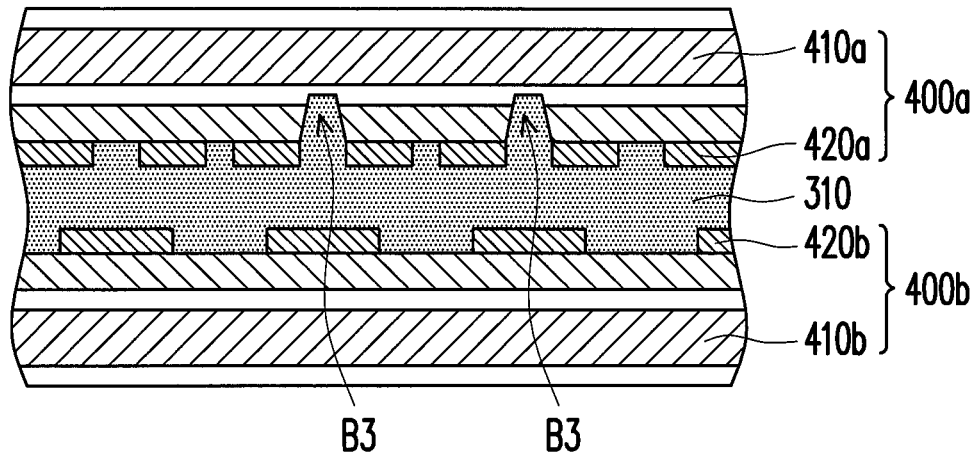

Referring to FIG. 3F, the first wiring carrying substrate 400a is laminated to a second wiring carrying substrate 400b via an insulation layer 310, wherein the insulation layer 310 full fills the first blind via B3. The second wiring carrying substrate 400b includes a second carry substrate 410b and a second wiring layer 420b, wherein the second wiring layer 420b is disposed on the second carry substrate 410b. Structure of the first wiring carrying substrate 400a is similar to that of the second wiring carrying substrate 400b, and structure of the second carry substrate 410b is the same to that of the first carry substrate 410a, and therefore detailed descriptions thereof are not repeated.

Figure 3G:
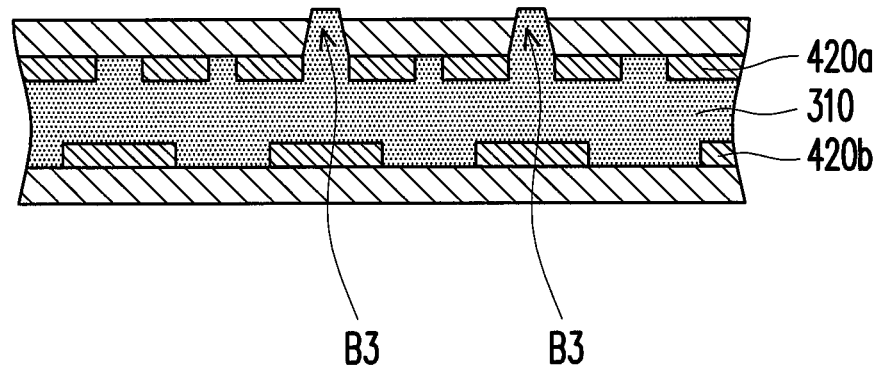

Referring to FIG. 3F and FIG. 3G, a part of the first carry substrate 410a and a part of the second carry substrate 410b are removed to expose the insulation layer 310 in the first blind via B3. The method of removing a part of the first carry substrate 410a and a part of the second carry substrate 410b is the same to the method of removing a part of the first carry substrate 210a and a part of the second carry substrate 210b of the aforementioned embodiment, and therefore detailed descriptions thereof are not repeated.

After a part of the first carry substrate 410a and a part of the second carry substrate 410b are removed, steps shown in FIG. 2F to FIG. 2G are then performed, and since the steps shown in FIG. 2F to FIG. 2G have been described in the aforementioned embodiment, follow-up steps after the step of FIG. 3G are not repeated.

In summary, before the wiring carrying substrate (i.e. the first wiring carrying substrate) is laminated to the insulation layer, at least one blind via is preformed on the wiring carrying substrate. When the wiring carrying substrate is laminated, the insulation layer full fills the blind via. After a part of the carry substrate is removed, the insulation layer in the blind via is exposed.

Though the insulation layer is deformed during laminating the wiring carrying substrate, shifting of the relative position (i.e. the layer-layer shifting) between layouts of the wiring layers (i.e. the first wiring layer and the second wiring layer) due to the deformation is controlled within a relatively low level, in which only a whole size performance of the wiring board is changed, and shifting of the relative positions between the hole (including the conductive through hole and conductive blind via) positions and the layouts of the wiring layers can be mitigated by marking the correct positions on the exposed insulation layer in the blind via for the holes to be formed.

Moreover, during formation of the holes, the laser beam which can easily thermally ablate the insulation layer without damaging the carry substrate and the wiring layer is applied, for example, the laser beam provided by the carbon dioxide laser device. Therefore, the holes can be accurately formed in the blind via.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A process for fabricating a wiring board, comprising:
   forming a first wiring carrying substrate including a first carry substrate and a first wiring layer disposed on the first carry substrate;

forming at least a first blind via in the first wiring carrying substrate, wherein the first blind via extends from the first wiring layer into the first carry substrate;

laminating the first wiring carrying substrate to a second wiring carrying substrate via an insulation layer, wherein the second wiring carrying substrate includes a second carry substrate and a second wiring layer disposed on the second carry substrate, the insulation layer is disposed between the first wiring layer and the second wiring layer, and full fills the first blind via;

removing a part of the first carry substrate and a part of the second carry substrate to expose the insulation layer in the first blind via;

removing a part of the insulation layer in the first blind via to form a hole extending from the first wiring layer to the second wiring layer;

forming a conductive pillar in the hole, wherein the conductive pillar is connected between the first wiring layer and the second wiring layer; and removing the remained first carry substrate and the remained second carry substrate.

2. The process for fabricating a wiring board as claimed in claim 1, wherein a method of forming the hole comprises thermally ablating a part of the insulation in the first blind via by using a laser beam.

3. The process for fabricating a wiring board as claimed in claim 2, wherein the laser beam is provided by a carbon dioxide laser device, an ultra violet laser device or a yttrium aluminium garnet (YAG) laser device.

4. The process for fabricating a wiring board as claimed in claim 1, wherein a method of forming the hole comprises performing a mechanical drilling process.

5. The process for fabricating a wiring board as claimed in claim 1, wherein the second wiring carrying substrate has at least a second blind via extending from the second wiring layer to the second carry substrate, and when the first wiring carrying substrate is laminated on the second wiring carrying substrate via the insulation layer, the insulation layer further full fills the second blind via, and after a part of the second carry substrate is removed, the insulation layer in the second blind via is exposed.

6. The process for fabricating a wiring board as claimed in claim 5, wherein the second blind via is opposite to the first blind via, and when a part of the insulation layer in the first blind via is removed, a part of the insulation layer in the second blind via is also removed for connecting the first blind via and the second blind via.

7. The process for fabricating a wiring board as claimed in claim 1, wherein a method of forming the first wiring carrying substrate comprises:

forming a mask layer on the first carry substrate, wherein the mask layer partially covers a surface of the first carry substrate; and forming the first wiring layer and a barrier layer, wherein the first wiring layer and the barrier layer are located on the surface of the first carry substrate partially exposed by the mask layer, the first wiring layer is located between the barrier layer and the first carry substrate, and the first wiring layer and the barrier layer wholly cover the surface of the first carry substrate.

8. The process for fabricating a wiring board as claimed in claim 7, wherein a method of forming the first blind via comprises:

removing a part of the mask layer to form at least an opening partially exposing the first carry substrate; and removing a part of the first carry substrate in the opening.

9. The process for fabricating a wiring board as claimed in claim 8, wherein a method of removing a part of the mask layer comprises removing a part of the mask layer by using a laser beam.

10. The process for fabricating a wiring board as claimed in claim 8, wherein a method of removing the first carry substrate comprises etching the first carry substrate.

11. The process for fabricating a wiring board as claimed in claim 8, wherein after the first blind via is formed, the process further comprises removing the barrier layer and the remained mask layer.

12. The process for fabricating a wiring board as claimed in claim 1, wherein a method of forming the blind via comprises thermally ablating a part of the first carry substrate by using a laser beam.

13. The process for fabricating a wiring board as claimed in claim 1, wherein the insulation layer is a resin layer or prepreg.

* * * * *